United States Patent
Ezaki et al.

(10) Patent No.: US 6,678,307 B2
(45) Date of Patent: Jan. 13, 2004

(54) SEMICONDUCTOR SURFACE LIGHT-EMITTING DEVICE

(75) Inventors: Mizunori Ezaki, Yokohama (JP); Keiji Takaoka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/254,624

(22) Filed: Sep. 26, 2002

(65) Prior Publication Data

US 2003/0063649 A1 Apr. 3, 2003

(30) Foreign Application Priority Data

Sep. 28, 2001 (JP) ........................................ 2001-302640

(51) Int. Cl.[7] ................................................. H01S 3/08
(52) U.S. Cl. ............................................ 372/96; 372/98
(58) Field of Search ............................... 372/96, 98, 99; 438/22

(56) References Cited

U.S. PATENT DOCUMENTS 5,493,577 A    2/1996  Choquette et al.
5,696,389 A  * 12/1997  Ishikawa et al. ............... 257/99
2002/0134987 A1 *  9/2002  Takaoka ....................... 257/98
2002/0137245 A1 *  9/2002  Kitamura et al. ............. 438/22

FOREIGN PATENT DOCUMENTS

JP    9-266350    10/1997
JP    2001-160658  6/2001

* cited by examiner

*Primary Examiner*—Paul Ip
*Assistant Examiner*—Hung T Vy
(74) *Attorney, Agent, or Firm*—Oblon, Spivak, McClelland, Maier & Neustadt, P.C.

(57) ABSTRACT

A semiconductor surface light-emitting device comprises, in a multi-layered structure formed on a substrate, a light-emitting part surrounded by a groove or grooves, provided with an active layer, a vertical cavity and a current aperture, a peripheral part external to the grooves, and a connecting portion connecting the light-emitting part with the peripheral part. There is provided an empty space or a high-resistance region on the upper part of this multi-layered connecting portion, which includes at least the current aperture formed layer or the active layer. This configuration effectively eliminates a path for a leakage current flowing into the peripheral part from the light-emitting part.

20 Claims, 6 Drawing Sheets

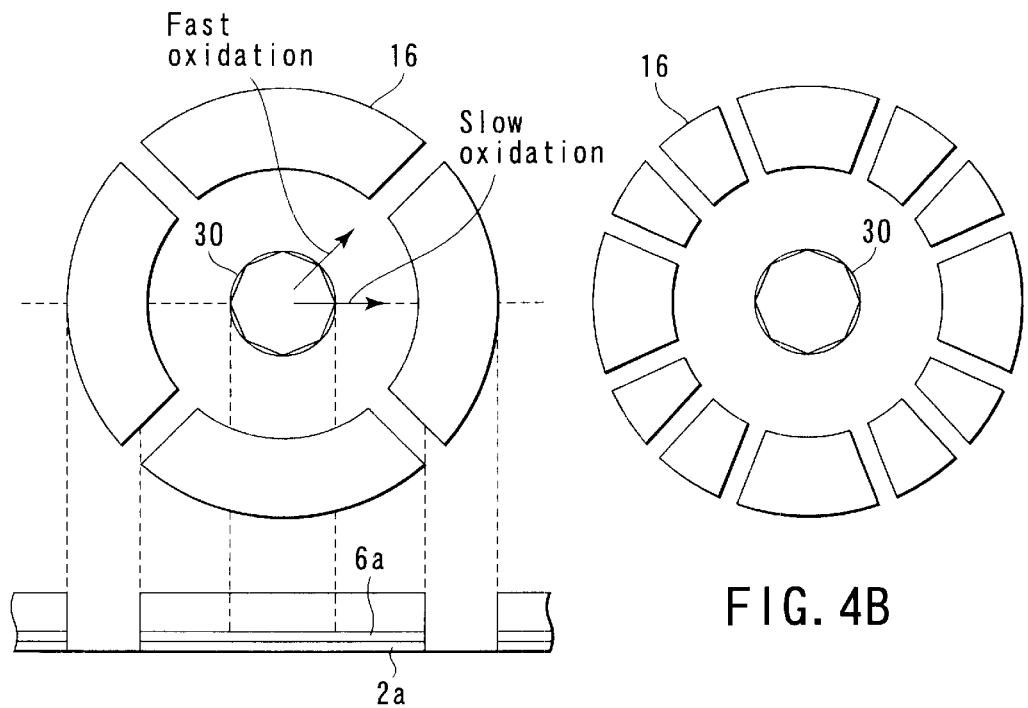
FIG. 4A
FIG. 4B
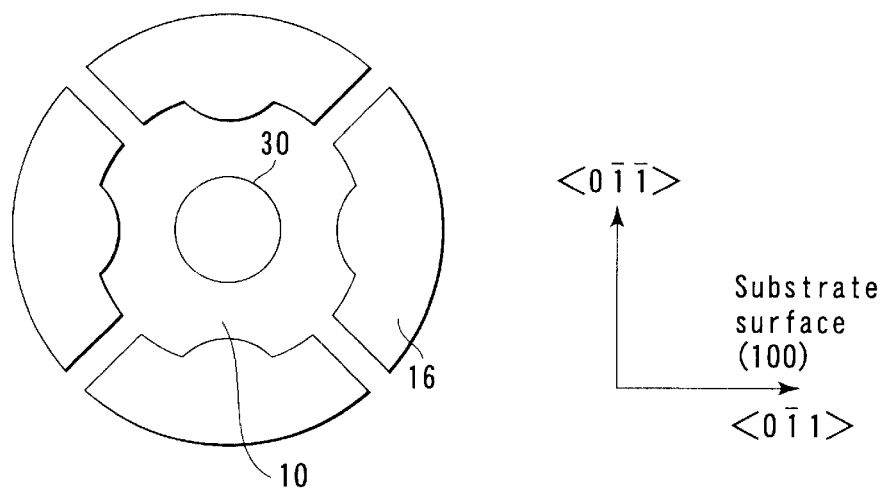
FIG. 4C
FIG. 4D

SEMICONDUCTOR SURFACE LIGHT-EMITTING DEVICE

CROSS-REFERENCE TO RELATED APPLICATIONS

This application is based upon and claims the benefit of priority from the prior Japanese Patent Application No. 2001-302640, filed Sep. 28, 2001, the entire contents of which are incorporated herein by reference.

BACKGROUND OF THE INVENTION

1. Field of the Invention

The present invention relates generally to semiconductor lasers, and more particularly to semiconductor lasers of the vertical-cavity surface-emitting type.

2. Description of the Related Art

Semiconductor light-emitting devices such as semiconductor lasers, semiconductor light-emitting diodes, etc., are widely used not only in the optical communication field, but also in the consumer field and the commercial field represented by optical disk systems using CD (Compact Disc), DVD (Digital Versatile Disc), etc., or by barcode readers, etc.

Of these semiconductor light-emitting devices, a vertical-cavity surface-emitting laser configures an optical cavity structure using an active layer sandwiched between a pair of mirror stack and emits a laser beam perpendicularly to a surface of semiconductor substrate.

Since the vertical-cavity surface-emitting laser enables two-dimensional integration of various laser devices on the substrate, much attention is focused on the vertical-cavity surface-emitting laser as a key device for high-speed LAN (Local Area Network), optical interconnects, etc., in the optoelectronics field.

The vertical-cavity surface-emitting laser is featured as follows.

Compared to an edge-emitting semiconductor laser, for example, the vertical-cavity surface-emitting laser has many advantages such as a low threshold current operation, low power consumption, high luminescence efficiency, capable of high-speed modulation, a small beam divergence for easy connection to an optical fiber, requiring no edge cleavage, excellent for mass production, etc.

In addition to these features, the vertical-cavity surface-emitting laser is optimal as an optical source for high-speed optical links. In combination with plastic optical fibers, it is expected to provide an optical source for high-speed optical links at low prices. Research and development is conducted extensively for this purpose.

The vertical-cavity surface-emitting laser requires a current confinement portion for efficiently injecting electric currents into an active region. A method for forming the current confinement portion is to form a high-resistance region by means of proton implantation and define a current aperture. However, this method requires complicated manufacturing processes, thus increasing costs.

Another method proposed is to form a laser structure comprising a layer to be oxidized which includes a high-Al content layer (AlGaAs layer, for example), etch the layer in a mesa, selectively and laterally oxide the layer to be oxidized from a side face of the mesa (lateral selective oxidation), and use a non-oxidized region as a current aperture. However, this method causes problems such that interconnection breakage occurs due to a step formed between the mesa and the peripheral portion thereof, and oxidation of the layer to be oxidized which includes the high-Al content layer involves volume shrinkage thereof, with result that stress is induced in the mesa.

It has been long expected to provide a highly reliable semiconductor surface light-emitting device that can be manufactured with a simple process and to provide a method for manufacturing thereof.

BRIEF SUMMARY OF THE INVENTION

A semiconductor light-emitting device which emits the light vertical to a top surface, according to a first aspect of the invention comprises:

a substrate having a first principal surface and a second principal surface;

a first electrode formed on the first principal surface of the substrate;

a multi-layered structure having a light-emitting part, a groove, and a peripheral part which is formed on the second principal surface of the substrate;

the light-emitting part of a column shape substantially surrounded by the groove extending from a surface of the multi-layered structure and substantially isolated from the peripheral part by the groove, the groove having deeper portions and shallower portions alternately arranged, the light-emitting part comprising:

a first multi-layered reflecting mirror layer formed on the first principal surface of the substrate, the deeper portions of the groove extending into the first multi-layered reflecting mirror layer;

a semiconductor active layer formed above the first multi-layered reflecting mirror layer;

a second multi-layered reflecting mirror layer formed above the semiconductor active layer; and a current confinement path defined and surrounded by an oxidized region of at least one of the first and second multi-layered reflecting mirror layers, the shallower portions of the groove extending to the oxidized region;

the peripheral part of the multi-layered structure surrounding the light-emitting part via the groove;

a second electrode formed on the top surface of the light-emitting part and having an opening formed above the current confinement path, the second electrode being configured to make a current path to the first electrode through the current confinement path;

a third electrode for external connection formed on the peripheral part of the multi-layered structure; and interconnection conductors bridging between the second and third electrodes to establish electrical connections above the shallower portions of the groove, respectively.

A semiconductor light-emitting device which emits the light vertical to a top surface, according to a second aspect of the invention comprises:

a substrate having a first principal surface and a second principal surface;

a first electrode formed on the first principal surface of the substrate;

a multi-layered structure having a light-emitting part, grooves, and a peripheral part which is formed on the second principal surface of the substrate;

the light-emitting part of a column shape substantially surrounded by the grooves extending from a surface the multi-layered structure and partially connected to the peripheral part at high resistance connecting portions between opposing ends of adjacent ones of the grooves, the light-emitting part comprising;
  a first multi-layered reflecting mirror layer formed on the first principal surface of the substrate, the grooves extending into the first multi-layered reflecting mirror layer;
  a semiconductor active layer formed above the first multi-layered reflecting mirror layer;
  a second multi-layered reflecting mirror layer formed above the semiconductor active layer; and
  a current confinement path defined and surrounded by an oxidized region of at least one of the first and second multi-layered reflecting mirror layers;
the peripheral part of the multi-layered structure surrounding the light-emitting part via the grooves; and
a second electrode formed on the top surface of the light-emitting part and having an opening formed above the current confinement path, the second electrode being configured to make a current path to the first electrode through the current confinement path;
a third electrode for external connection formed on the peripheral part of the multi-layered structure; and
interconnection conductors formed on the connecting portions and connecting the second electrode with the third electrode.

A semiconductor light-emitting device which emits the light vertical to a top surface, according to a third aspect of the invention comprises:
  a substrate having a first principal surface and a second principal surface;
  a first electrode formed on the first principal surface of the substrate;
  a multi-layered structure having a light-emitting part, grooves, and a peripheral part which is formed on the second principal surface of the substrate;
  the light-emitting part of a column shape substantially surrounded by the grooves extending from a surface of the multi-layered structure and partially connected to the peripheral part at high resistance connecting portions between opposing ends of adjacent ones of the grooves, the light-emitting part comprising:
    a first multi-layered reflecting mirror layer formed on the first principal surface of the substrate, the grooves extending into the first multi-layered reflecting mirror layer;
    a semiconductor active layer formed above the first multi-layered reflecting mirror layer;
    a second multi-layered reflecting mirror layer formed above the semiconductor active layer; and
    a current confinement path defined and surrounded by an oxidized region of at least one of the first and second multi-layered reflecting mirror layers, and the oxidized region having oxidation anisotropy providing a first direction of a high oxidation rate and a second direction of low oxidation rate with respect to a crystal orientation of the first multi-layered reflecting mirror layer or the second multi-layered reflecting mirror layer, a distance from a side of the light-emitting part to the current confinement path in the first direction being longer than a distance from a side of the light-emitting part to the light-emitting region in the second direction;
  the peripheral part of the multi-layered structure surrounding the light-emitting part via the grooves; and
  a second electrode formed on the top surface of the light-emitting part and having an opening formed above the current confinement path, the second electrode being configured to make a current path to the first electrode through the current confinement path;
  a third electrode for external connection formed on the peripheral part of the multi-layered structure; and
  interconnection conductors formed on the connecting portions and connecting the second electrode with the third electrode.

A semiconductor light-emitting device according to a fourth aspect of the invention has the same configuration as that of the light-emitting device according to the third aspect, wherein the oxidized region of the current confinement path has oxidation anisotropy providing a first direction of a high oxidation rate and a second direction of low oxidation rate with respect to a crystal orientation of the first multi-layered reflecting mirror layer or the second multi-layered reflecting mirror layer, and the first direction is directed to the high resistance connecting portions.

BRIEF DESCRIPTION OF THE SEVERAL VIEWS OF THE DRAWING

FIGS. 4A through 4C are top views showing different shapes (oxide-free regions) of the light-emitting region that remains unoxidized in the light-emitting part according to the first embodiment, wherein FIG. 4A is accompanied by a corresponding schematic sectional view;

FIG. 4D is a view showing a crystal orientation arrangement of a substrate used in FIGS. 4A–4C.

DETAILED DESCRIPTION OF THE INVENTION

Prior to description of embodiments of the present invention, the following explains a semiconductor surface light-emitting device prototype according to the selective oxidation comprising simpler processes the inventors examined.

Figure 1A:
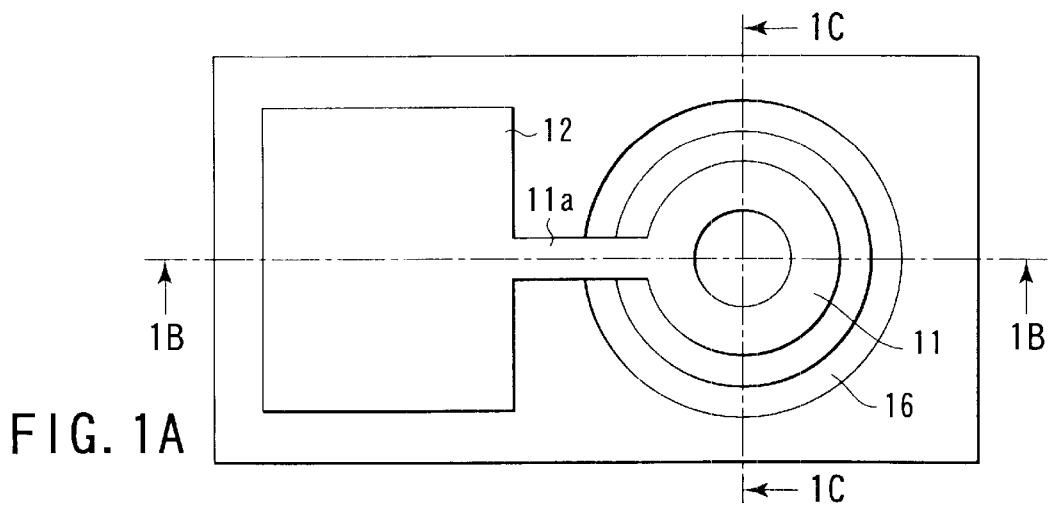
FIG. 1A is a top view showing the configuration of a prototypic semiconductor surface light-emitting device relating to the present invention.
Figure 1B:
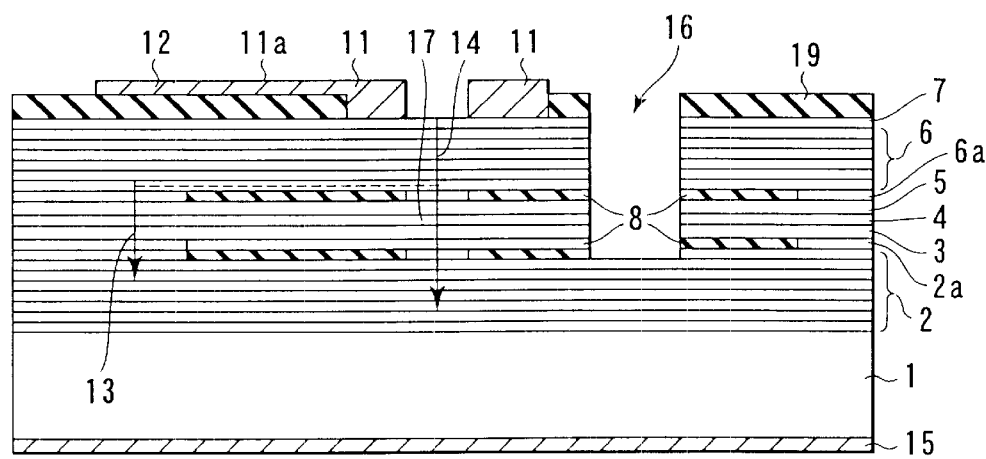
FIG. 1B is a cross-sectional view taken along the line 1B—1B in FIG. 1A.
Figure 1C:
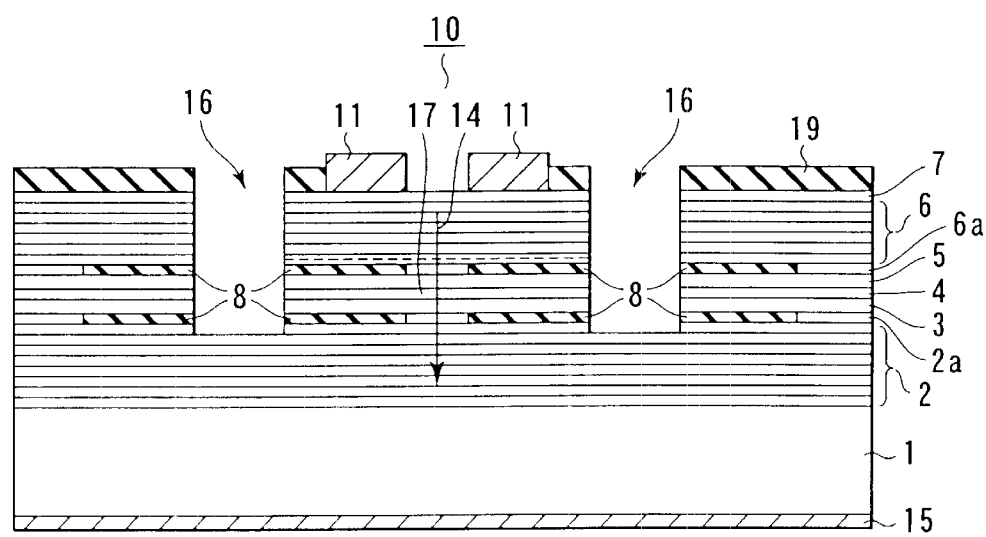
FIG. 1C is a cross-sectional view taken along the line 1C—1C in FIG. 1A.

As shown in FIGS. 1B and 1C, the surface light-emitting device (semiconductor laser) has a multi-layered structure and includes a semiconductor multilayer reflecting mirror 2 comprising alternately layered semiconductor films of different compositions; a clad layer 3; a semiconductor active layer 4; a clad layer 5; a semiconductor multilayer reflecting mirror 6 comprising alternately layered semiconductor films of different compositions; and a contact layer 7. These layers are successively formed on a semiconductor substrate 1.

As shown at the center of FIG. 1C, the light-emitting part 10 is formed in a column by partially separating the semiconductor multilayer reflecting mirror 2, the clad layer 3, the semiconductor active layer 4, the clad layer 5, the semiconductor multilayer reflecting mirror 6, and the contact layer 7 with a groove 16.

The top surface of the device is covered with an insulating film 19 such as silicon oxide. A contact electrode 11 is formed on the light-emitting part 10. The center of the contact electrode 11 is opened for extracting light from the light-emitting region 17.

A top layer 2a on the semiconductor multilayer reflecting mirror 2 and a bottom layer 6a under the semiconductor multilayer reflecting mirror 6 are semiconductor layers to be oxidized with a high Al composition ratio. The layer 2a and the layer 6a are oxidized laterally from the side of the light-emitting part 10 to the light-emitting region 17 of the semiconductor active layer 4 to form a current aperture (current confinement path) 8 for current confinement. The layer 2a and the current aperture 8 and the layer 6a and the current aperture 8 each form current aperture layers.

A contact electrode 11 is connected to an external connection electrode (bonding pad) 12 via an interconnection 11a. An electrode 15 is formed on the rear of the substrate 1.

In the vertical-cavity surface-emitting laser having this structure, the groove 16 is not formed under the interconnection (conductors) 11a connecting the contact electrode 11 with the external connection electrode 12. The multi-layered structure is formed in the same manner as is done under the external connection electrode 12.

The method for forming the above-mentioned light-emitting device will now be described. First, there are formed the semiconductor multilayer reflecting mirror 2, the clad layer 3, the semiconductor active layer 4, the clad layer 5, the semiconductor multilayer reflecting mirror 6, and the contact layer 7 in succession on the semiconductor substrate 1. At this time, the semiconductor multilayer reflecting mirrors 2 and 6 are formed as the multi-layered structure comprising a repetition of an $Al_{0.95}Ga_{0.05}As$ film and an $Al_{0.5}Ga_{0.5}As$ film, for example. The semiconductor layers 2a and 6a to be oxidized are formed in continuation to the semiconductor multilayer reflecting mirrors 2 and 6 by using an $Al_xGa_{1-x}As$ (x>0.95) layer having a greater Al composition ratio than the layers forming the reflecting mirrors 2 and 6.

Then, the groove 16 is formed by etching. The substrate temperature is raised to 400° C. or more in a water vapor transported in an inert gas. Due to this process, the AlGaAs films 2a and 6a having the high Al composition ratio are oxidized in the semiconductor multilayer reflecting mirrors 2 and 6 from a portion near to the groove 16 and become $Al_xO_y$ films. The oxidation rate remarkably varies with Al compositions. When $Al_xGa_{1-x}As$ is used where x=0.95 through 1, it is possible to selectively oxidize only the layers 2a and 6a having the concentrated Al with little effect on the clad layers 3 and 5 and the active layer 4.

This lateral oxidation process progresses the oxidation from the groove side to form the current aperture, forming an unoxidized region, i.e., an aperture (oxide-free region) at the center of the light-emitting part. At this time, properly adjusting the temperature and the time for heat processing can control the shape and the size of the aperture as part of the semiconductor layer to be oxidized highly containing Al.

In the light-emitting device formed as mentioned above, an electric current injected from the contact electrode 11 flows into the light-emitting region of the semiconductor active layer 3 as indicated with an arrow 14 to generate light. As indicated with an arrow 13, however, part of the current passes the semiconductor multilayer reflecting mirror 6 under the interconnection 11a and reaches the semiconductor substrate 10 via a non-oxidized region, as shown in FIG. 1B. There occurs a problem that this current becomes a leakage current and flows to the outside of the device. The leakage current tends to increase as the aperture diameter becomes small, for example. This is because a small aperture diameter causes a large resistance in a current channel portion (current aperture), relatively causing much current flowing to the outside of the light-emitting part as indicated with the arrow 13.

As mentioned above, the above-mentioned semiconductor surface light-emitting device inevitably generates a leakage current flowing under the interconnection 11a. Consequently, the threshold current and the parasitic capacitance increase, degrading the fast response.

When the above-mentioned manufacturing method is used to oxidize the AlAs and $Al_xGa_{1-x}As$ layers (x>0.95) highly containing Al, the oxidation rate in the <100> axis direction is faster than that in the <110> axis direction. There is anisotropic oxidation in which oxidation rates depend on crystal orientations. When the device is viewed from the top, the shape of the current aperture does not become circular.

Figure 2A:
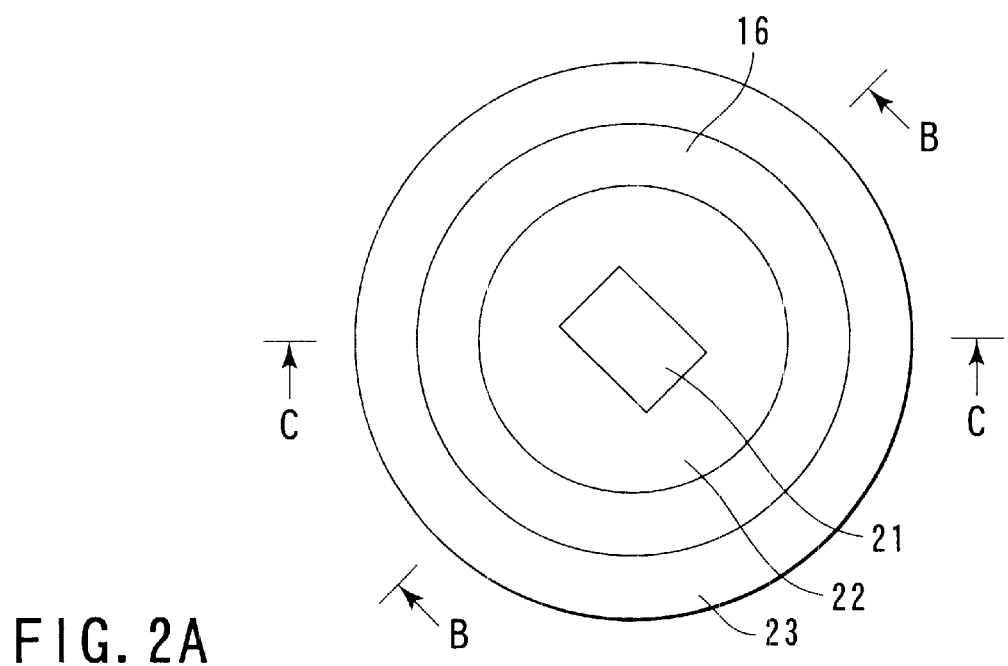
FIGS. 2A and 2B are top views showing different shapes (oxide-free regions) of a light-emitting region that remains unoxidized in a light-emitting part 10 in FIGS. 1A through 1C.
Figure 2B:
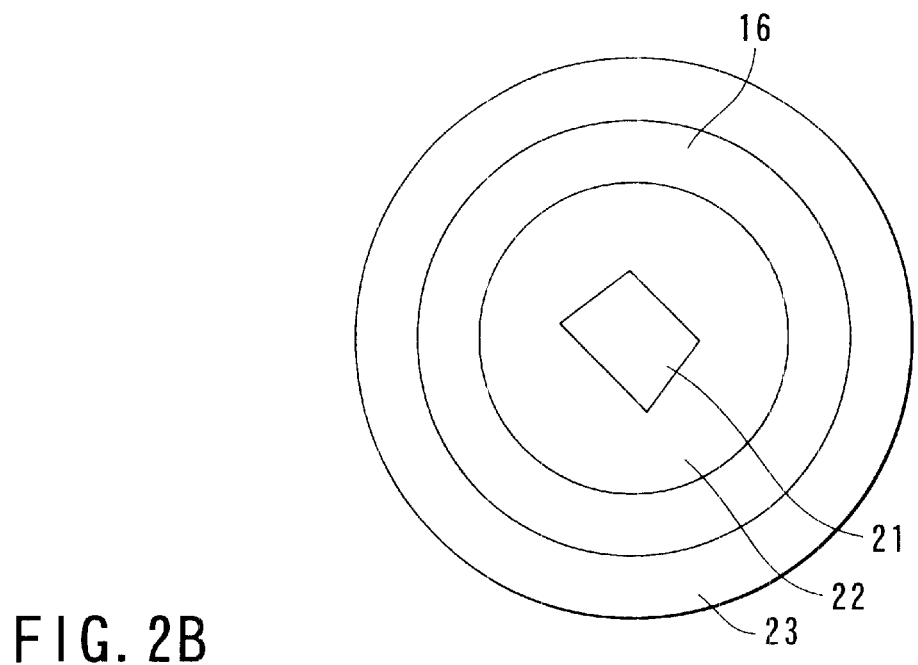

FIGS. 2A and 2B show states of oxidation conducted from the side of the light-emitting part whose horizontal section is circular. As shown in FIG. 2A, the oxidation rate of the layer to be oxidized in a given crystal axis direction is lower than that in a crystal axis direction orthogonal thereto. Accordingly, it is found that an aperture (oxide-free region) 21 is rectangular. This aperture shape causes a problem that the aspect ratio of the rectangle varies with the oxidation time and it is difficult to control an irradiated beam shape and the transverse mode of laser beam. In FIGS. 2A and 2B, reference numerals 22 and 23 represent oxidizing regions and 16 the above-mentioned groove.

In general, when the selective oxidation is used to form the current aperture for the vertical-cavity surface-emitting laser, this laser provides an intense optical confinement effect having a large refractive index difference between the oxidized layer and the non-oxidized layer (oxide-free layer). Because of this, stabilizing the transverse single mode of laser beam requires narrowing the light-emitting region, i.e., the aperture diameter typically down to 5 μm or less.

However, the above-mentioned method generates a distorted rectangle for the aperture, i.e., the shape of the current aperture viewed from the top of the device, making the control difficult. It is difficult to highly precisely control its size. Moreover, the vertical-cavity surface-emitting laser often uses an off-axis substrate, not an ordinary substrate having a surface (100), for controlling the polarization mode of laser beam. In this case, the anisotropic oxidation dependent on crystal orientations further distorts the shape of the aperture depending on an off-axis angle. The normal circular column light-emitting part structure causes an aperture 21 as shown in FIG. 2B to be diamond-shaped. It becomes more difficult to obtain an intended shape and transverse mode characteristics of laser beam.

When the wet oxidation is employed for the AlAs layer and the AlGaAs layer having the concentrated Al in the vertical-cavity surface-emitting laser containing the current aperture formed by the selective lateral oxidation, the volume of a layer to be oxidized shrinks and a strain is caused between vertically laminated layers. This is because the volume of the oxide $Al_xO_y$ shrinks approximately 30% to 40% compared to the original AlAs layer and the AlGaAs layer having the concentrated Al.

Accordingly, a compression stress is applied to the semiconductor active layer, especially to the light-emitting region after oxidation. For the effective current confinement, some thickness is needed for a semiconductor layer to be oxidized functioning as the current aperture. The thicker this layer becomes, the larger a strain results. The strain concentrates on the tip of the oxidized layer. Since the semiconductor layer to be oxidized is provided very near to the light-emitting region with a distance of 0.2 μm therefrom, the strain affects the light-emitting region at a portion where the current concentrates most frequently, shortening the device life.

For these reasons, the light-emitting device according to the above-mentioned configuration needs to suppress a leakage current to the outside of the device. It is necessary to improve the shape of the non-oxidized region caused by the anisotropic oxidation, that is, the shape of an irradiated beam pattern. Further, in consideration of the volume shrinkage due to oxidation of the Al-concentrated layer, it is necessary to decrease a compression stress applied to the semiconductor active region, prevent a crack or damage on an interface, and improve thermal tolerance after the selective oxidation process.

The following describes embodiments of the present invention capable of solving the above-mentioned problems with reference to the accompanying drawings.

(First Embodiment)

Figure 3A:
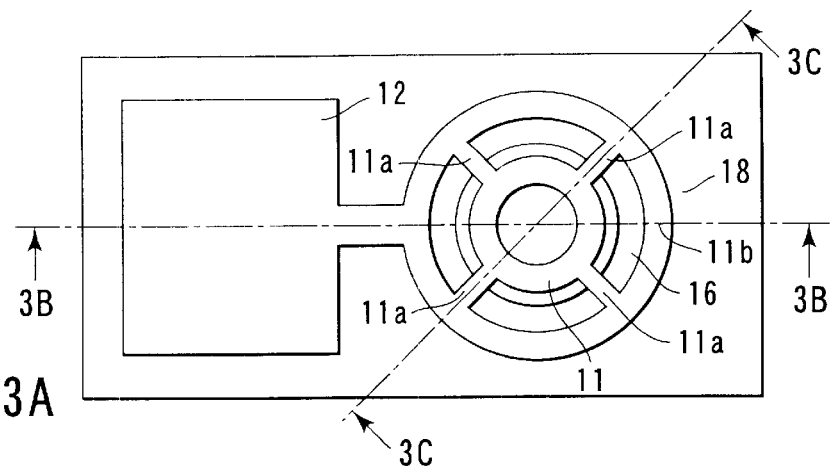
FIG. 3A is a top view showing the configuration of a semiconductor surface light-emitting device according to a first embodiment of the present invention.
Figure 3B:
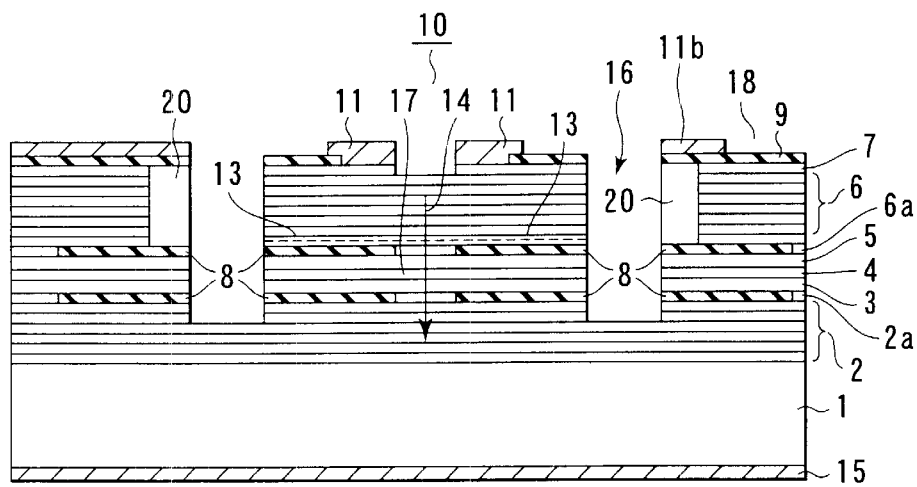
FIG. 3B is a cross-sectional view taken along the line 3B—3B in FIG. 3A.
Figure 3C:
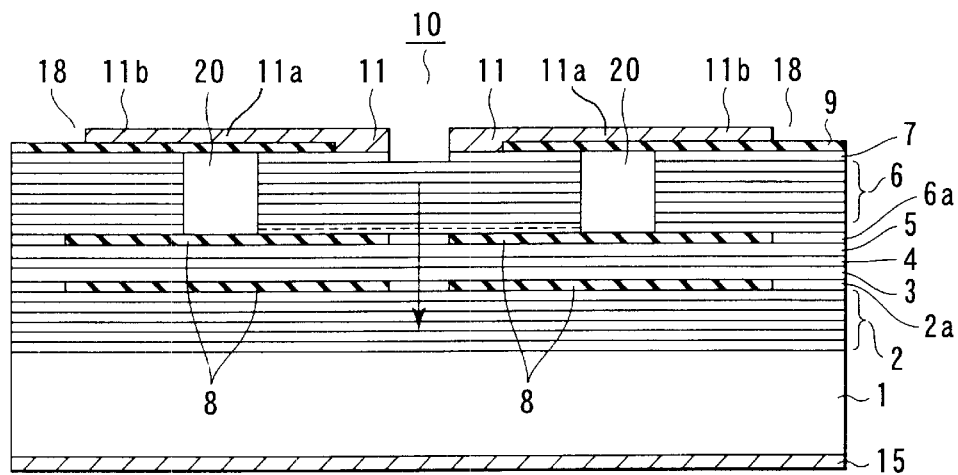
FIG. 3C is a cross-sectional view taken along the line 3C—3C in FIG. 3A.

The vertical-cavity surface-emitting laser according to the first embodiment, as shown in FIGS. 3A through 3C, includes the first semiconductor multilayer reflecting mirror 2 formed on the entire top surface of the substrate 1. A semiconductor clad layer 3 is formed on the first semiconductor multilayer reflecting mirror 2. A semiconductor active layer 4 having a light-emitting region 17 is formed on the semiconductor clad layer 3. A semiconductor clad layer 5 is formed on the semiconductor layer 4. The second semiconductor multilayer reflecting mirror 6 is formed on the semiconductor clad layer 5. The first and second reflecting mirrors form an optical cavity in a direction orthogonal to the substrate 1.

Surrounded by a plurality of grooves 16, a light-emitting part 10 shaped in an approximate column is formed approximately at the center of the laminated semiconductor layer at the top view. The groove 16 is formed so that the bottom thereof exists in the first multilayer reflecting mirror 2. The above-mentioned light-emitting region 17 is included in the light-emitting part 10.

A contact layer 7 is formed on the second semiconductor multilayer reflecting mirror 6. On the contact layer 7 in the light-emitting part 10, there is formed a contact electrode 11 for injecting an electric current into the light-emitting region 17. The contact electrode 11 is formed to have an aperture at its center so as to irradiate light from the light-emitting region 17. An electrode 15 is formed on the rear of the substrate 1. There is formed a current path between the electrode 15 and the contact electrode 11 via the light-emitting part 10 to inject an electric current into the light-emitting region 17.

The layer 2a is formed in continuation to the semiconductor multilayer reflecting mirror 2. The layer 6a is formed in continuation to the semiconductor multilayer reflecting mirror 6. The layers 2a and 6a are laterally oxidized from their sides toward the light-emitting region 17 and become insulating layers to form the current aperture (current confinement path) 8. This current aperture 8 is used to confine an electric current channel in the light-emitting region 17.

A peripheral part 18 is formed separated from the light-emitting part 10 by the groove 16. The peripheral part 18 also has the same multi-layered structure as the light-emitting part 10. The surface of the light-emitting part 10 and that of the peripheral part 18 are formed substantially at the same height.

A peripheral electrode 11b is formed on the peripheral part 18. The contact electrode 11 and the peripheral electrode 11b are connected by the interconnection part 11a. An empty space 20 is provided under the interconnection part 11a. The reference numeral 9 represents a film that is formed on the multi-layered structure surface and has a tensile stress. This film comprises a silicon nitride film, for example. The silicon nitride film 9 is also used as an etching mask film for pattern formation in addition to the stress control. The silicon nitride film 9 also works as a bridge for the fabrication of empty space 20 under the interconnection part 11a connecting the contact electrode 11 and the peripheral electrode 11b. The empty space 20 is formed not only under the interconnection part 11a, but also continuously on the upper portion of the peripheral side of the groove 16 (see FIG. 3B).

The peripheral electrode 11b is connected to a bonding pad 12. While FIG. 3A shows that the peripheral electrode 11b and the bonding pad 12 are formed in different regions, they may be formed as one part. Such a vertical-cavity surface-emitting laser can emit light by injecting an electric current into the light-emitting region 17 from the contact electrode 11 via the first semiconductor multilayer reflecting mirror 6 as indicated with the arrow 14.

At this time, the empty space 20 is formed below the interconnection part 11a connecting the contact electrode 11 with the peripheral electrode 11b. Because of this, the empty space 20 disables the current path indicated with the arrow 13 as shown in FIG. 1C. Accordingly, this vertical-cavity surface-emitting laser can flow an electric current through only the path indicated with the arrow 14. It is possible to very efficiently confine an electric current channel, providing a low threshold value and improving the high-speed modulation and the mass production. The following describes concretely how to manufacture this vertical cavity surface-emitting laser.

First, an MOCVD (Metal Organic Chemical Vapor Deposition) apparatus is used to sequentially form the n-type semiconductor multilayer reflecting mirror 2, the semiconductor layer to be oxidized 2a, the n-type clad layer 3, the semiconductor active layer 4, the p-type clad layer 5, the semiconductor layer to be oxidized 6a, the p-type semiconductor multilayer reflecting mirror 6, and the contact layer 7 on the cleaned 3-inch n-type GaAs substrate 1 with the thickness of 400 μm.

This light-emitting device has the above-mentioned structure as a basic structure and is designed as a red InGaAlP vertical-cavity surface-emitting laser with the light emission near 650 nm wave length.

The semiconductor multilayer reflecting mirror 2 is an AlGaAs semiconductor multilayer reflecting mirror doped with n-type impurities for $1\times10^{18}/cm^3$. The clad layer 3 is formed of an n-type $In_{0.5}(Ga_{0.3}Al_{0.7})_{0.5}P$. The semiconductor active layer 4 has a structure of five layers of a quantum well comprising $In_xGa_{1-x}P/In_{0.5}(Ga_{0.5}Al_{0.5})_{0.5}P$ that is adjusted to cause a light emission peak wavelength to be 650 nm. The clad layer 5 is formed of a p-type $In_{0.5}(Ga_{0.3}Al)_{0.5}P$. The semiconductor multilayer reflecting mirror 6 is an AlGaAs semiconductor multilayer reflecting mirror doped with p-type impurities for $1\times10^{18}/cm^3$.

The semiconductor film to be oxidized 2a is formed immediately below the clad layer 3 and uses $Al_xGa_{1-x}As$ (x>0.98) having an Al composition ratio larger than that of AlGaAs forming the semiconductor multilayer reflecting mirror 2. The semiconductor film to be oxidized 6a is formed immediately above the clad layer 5 and uses $Al_xGa_{1-x}As$ (x>0.98) having an Al composition ratio larger than that of AlGaAs forming the semiconductor multilayer reflecting mirror 6. The contact layer 7 is formed of p-type carbon doped GaAs.

The AlGaAs semiconductor multilayer reflecting mirrors 2 and 6 use a structure of alternately laminating the $Al_{0.95}Ga_{0.05}As$ layer and the $Al_{0.5}Ga_{0.5}As$ layer so that the optical film thickness becomes one quarter of the cavity wavelength.

A strained film 9 having a tensile stress is formed next. The embodiment uses the PECVD (Plasma Enhanced Chemical Vapor Deposition) method to form an $Si_3N_4$ film. At this time, the film stress is controlled by adjusting pressures and flow rates of $SiH_4$, $NH_3$, and $N_2$ as source gases to form the strained film having the tensile stress of 150 MPa.

A tensile stress value for the strained film 9 is determined by the following equation in consideration of thermal stress σT generated between the strained film 9 and the GaAs substrate 1.

$$\sigma T = E_F(\alpha F - \alpha S)\Delta T \quad (1)$$

where αF and αS are thermal expansion coefficients of the strained film 9 and the substrate 1, respectively; $E_F$ the Young's modulus for the strained film 9; and ΔT a temperature rise.

When the wet oxidation process temperature is set to 420° C., ΔT=400 K results. When the temperature is returned to the room temperature after the wet oxidation process, the GaAs substrate (αs $6.0\times10^{-6}$/K) applies a compression stress of σT=−158 MPa to the $Si_3N_4$ film ($E_F$=160 GPa, αF=$2.7\times10^{-7}$/K).

Accordingly, the embodiment forms the strained film 9 having a tensile stress to decrease the compression stress and decrease a compression stress applied to the semiconductor active layer 4, thus improving the thermal tolerance. Conventionally, an extensively used etching mask film, a laminate of $SiO_2$ ($E_F$=74 GPa, αF=$0.4\times10^{-6}$/K) for thin films and GaAs (αs=$6.0\times10^{-6}$/K) for substrates, causes a compression stress of αT=−124 MPa. In addition, such an etching mask $SiO_2$ film easily has a compression stress of approximately −200 MPa during film deposition. Consequently, an increased compression stress is applied to the semiconductor active layer 4, degrading the thermal tolerance.

Then, a commercially available photoresist film is coated on the substrate by a spin coater apparatus. A hot plate is used for baking to form a photoresist film with the film thickness of 350 nm. Then, an i-line stepper apparatus is used to expose mask patterns onto the photoresist film and transfer the patterns.

This first process exposes and transfers alignment marks for patterns. Then, development and baking processes are performed to form alignment mark patterns on the photoresist film.

Then, the photoresist film with the mark patterns is used for the pattern-transfer on the etching mask film 9 as a stress-controlled nitride film by $NH_4F$ wet etching. The photoresist film is removed by means of oxygen plasma ashing.

An alignment marks pattern for the contact layer 7 is wet-etched by using the etching mask 9 and a mixture of $NH_3/H_2O_2$.

Thereafter, commercially available photoresist is coated on the substrate. The hot plate is used for baking to form a photoresist film with 350 nm thickness. Then, the stepper is used to expose and transfer a contact hole pattern onto the photoresist film. The exposed film is developed. After a post-bake process, the contact hole pattern is formed on the photoresist film. Based on the photoresist film pattern, the contact pattern is etch-formed on the etching mask film 9. Thereafter, the photoresist film is removed by means of oxygen plasma ashing.

Likewise, commercially available photoresist is coated on the substrate. The hot plate is used for baking. Then, a photoresist film with 350 nm thickness is formed. The stepper is used to expose and transfer patterns for the surface p-side contact electrode 11, the bonding pad 12, the interconnection part 11a, and the peripheral electrode 11b at a time. After that, the photoresist film is developed, and the post-bake process is performed by using a hot plate. Thus, there are formed a pattern of the p-side contact electrode 11, the bonding pad 12, the interconnection part 11a, and the peripheral electrode 11b on the photoresist film.

Then, an electron beam evaporation apparatus is used for metal evaporation to form a Ti/Pt/Au film on the photoresist film. The lift-off method and a sinter process are used to form the contact electrode 11, and so forth.

To open a window region for laser emission, etching is performed to form an aperture in the GaAs contact layer 7. Thereafter, commercially available photoresist is coated on the substrate. The hot plate is used for baking. Then, a photoresist film with 350 nm thickness is formed. The stepper is used to expose and transfer a groove pattern for forming the light-emitting part onto the photoresist film. The photoresist film is developed, and the post-bake process is performed. By using the resist film pattern as an etching mask, etching is performed to form the pattern for forming the light-emitting part on the etching mask film 9.

By, using the pattern formed on the etching mask film 9, the plasma dry etching process is done using a chlorine-based gas to the multi-layered structure to form the grooves 16 and accordingly form the light-emitting part 10. Then, the oxygen plasma ashing is performed to remove the resist film.

As shown in FIGS. 3B and 3C, the plasma etching process is performed to form the light-emitting part 10. The etching process is done until the inside of the semiconductor multilayer reflecting mirror 2 appears so that edges of the semiconductor layers to be oxidized 6a and 2a are exposed to the side of the groove 16. At this time, the etching process is performed so as to divide the groove 16 into a plurality of portions.

Then, the wet oxidation process is preformed at 400° to 500° C. in a water vapor atmosphere to selectively oxidize the semiconductor layers to be oxidized 6a and 2a in a lateral direction.

In this case, FIGS. 4A through 4C show shapes of a light-emitting region (aperture) 30 remaining un-oxidized in the light-emitting part and the groove 16. Further, the substrate surface has (100) orientation, and the crystal axes are assigned as shown in FIG. 4D.

In this embodiment, the direction of the crystal axis with fast oxidation with respect to the semiconductor layers to be oxidized 6a and 2a is adjusted to the line 3C—3C of FIG. 3A, for example. Further, the direction of the crystal axis with slow oxidation with respect to the semiconductor layers to be oxidized 6a and 2a is adjusted to the line 3B—3B of FIG. 3A.

For example, reference to FIG. 2A helps understand settings of the above-mentioned crystal axis directions. Since the oxidation rate is fast for the semiconductor layers to be oxidized 6a and 2a along the line B—B in FIG. 2A, a long distance is assigned from the side of the groove 16 to the light-emitting region 21. Since the oxidation rate is low for the semiconductor layers to be oxidized 6a and 2a along the line C—C in FIG. 2A, a short distance is assigned from the side of the groove 16 to the light-emitting region 21.

In the embodiment, the semiconductor layers to be oxidized 6a and 2a are configured so that the direction for fast oxidation according to the arrangement (the direction along the line 3B—3B in FIG. 3A) is adjusted to the direction for slow oxidation according to the crystal orientation (the direction along the line B—B in FIG. 2A). These layers are further configured so that the direction for slow oxidation according to the arrangement (the direction along the line 3A—3A in FIG. 3A) is adjusted to the direction for fast oxidation according to the crystal orientation. Finally, it is easy to uniform lateral oxidation distances from the groove's side around the light-emitting region. As a result, the light-emitting region 30 is shaped to be more approximate to a circle (FIG. 4A).

The lateral oxidation from the groove 16 toward the inside becomes slower along the direction (e.g., the line 3C—3C in FIG. 3A) connecting a boundary (a region for the interconnection part 11a) between the symmetrically divided grooves 16 with the center of the light-emitting region 10 compared to the direction (e.g., the line 3B—3B in FIG. 3A) connecting the groove center with the center of the light-emitting region 10. This is because the semiconductor layers to be oxidized 6a and 2a along the line 3C—3C are not exposed to the groove 16 as being apparent from FIG. 3A. The light-emitting region 30 can be controlled to be any shape by adjusting the relationship between the arrangement of the subdivided grooves 16 and the crystal orientation of the semiconductor layers to be oxidized 6a and 2a in consideration of this anisotropic oxidation process.

FIG. 4B shows the further subdivided grooves 16. By further subdividing the grooves 16, it is possible to allow the light-emitting region 30 to be shaped to be more approximate to a circle.

As shown in FIG. 4C, a side of the light-emitting part 10 is scraped off along the direction for slow oxidation of the semiconductor layers to be oxidized 6a and 2a, enabling to shorten the distance between the side and the light-emitting region 30. This makes it possible to allow the light-emitting region 30 to be shaped to be much more approximate to a circle.

Figures 5A, 5B:
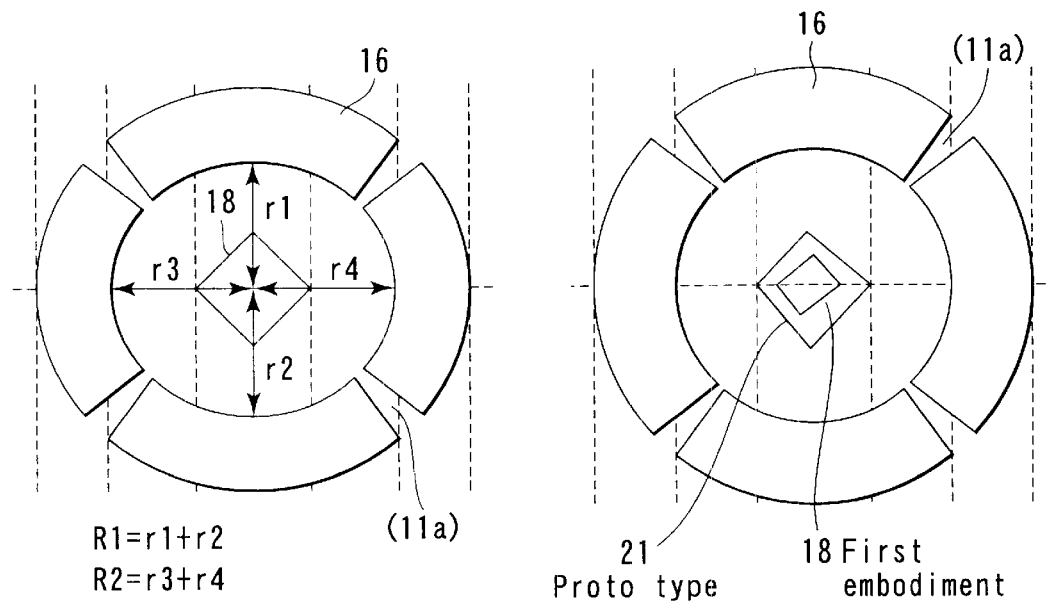
FIGS. 5A through 5C are top views showing different shapes (oxide-free regions) of the light-emitting region that remains unoxidized in the light-emitting part according to the first embodiment.
Figure 5C:
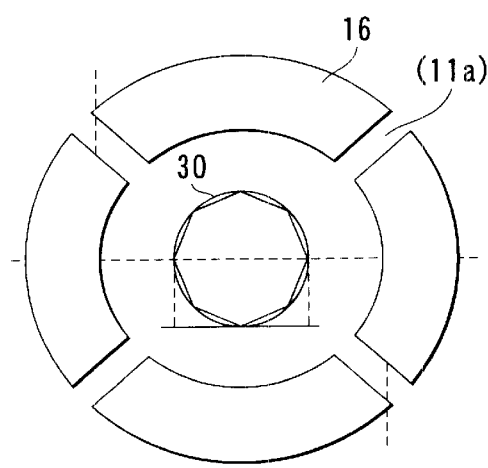

In the embodiment, an off-axis substrate may be used for the substrate 1 in order to control and stabilize the polarization mode of laser beam. FIGS. 5A through 5C show suitable shapes of the light-emitting region when the off-axis substrate is used.

Since the off-axis substrate has a substrate surface slanting from the normal surface, the crystal orientation varies with off-axis directions and angles. We measured an oxidation rate for each orientation in the substrate surface. As a result of examining the light-emitting part configuration based on the measurement values, we found that, as shown in FIGS. 5A through 5C, the light-emitting region 18 and 30 can be formed in any shape such as a square or a rectangle (FIGS. 5A and 5B), a circle (FIG. 5C), etc. This method is described below.

According to the embodiment, the interconnection part (11a) to the light-emitting part 10 is arranged so as to maintain a symmetry with respect to the center. The interconnection part 11a portion uses a pattern having the interconnection width of 1 to 5 μm. If the light-emitting region 18 is shaped to be square or rectangular, a narrower interconnection width is preferable at the juncture with the light-emitting part (10) so as not to shape the light-emitting region 18 to be polygonal. According to the study here, the interconnection part width becomes smaller as the position of the interconnection part comes closer to the light-emitting part (10).

To form the rectangular or square light-emitting region 18 with the lengths of l and m, the light-emitting part having an oval or circular transverse cross section with the radiuses of $R_1$ and $R_2$, satisfies the following relational expression.

$$R_2 = m + b(x,T) \times (R_1 - l)/a(x,T) \quad (2)$$

In this expression, a(x,T) denotes an oxidation rate of $Al_xGa_{1-x}As$ (x>0.94) in the <100>axis direction at wet oxidation process temperature T° C.; and b(x, T) an oxidation rate in the <110>axis direction.

The off-axis substrate enables control over any shape and size for the light-emitting region by using a pattern shape and a pattern arrangement that allow the divided groove 16 to be positioned near to or distant from the light-emitting part center corresponding to an oxidation rate along the orientation. In this case, the oxidation rate a(x,T) may be corrected with correction functions f1(x,T,θ) and f2(x,T,θ) with reference to off-axis angle θ. The oxidation rate b(x,T) may be corrected with correction functions f3(x,T,θ) and f4(x,T,θ). The transverse cross section of the above-mentioned light-emitting part may be formed so that the radiuses $R_1$ and $R_2$ satisfy the following expression.

$$R_2 = m + b(x,T) \times (R_1 - l)/a(x,T) \times (f3(x,T,\theta) + f4(x,T,\theta))/(f1(x,T,\theta) + f2(x,T,\theta)) \quad (3)$$

Also in this case, it is possible to form the rectangular or square light-emitting region with the specified lengths l and m.

When the groove 16 is divided into four portions, as shown in FIG. 5A the oval or circular light-emitting part is formed so as to satisfy the following relationships:

$$r1 = 1/2 + f1(x,T,\theta) \times (R_1 - 1)/(f1(x,T,\theta) + f2(x, T,\theta)) \quad (4)$$

$$r2 = 1/2 + f2(x,T,\theta) \times (R_1 - 1)/(f1(x,T,\theta) + f2(x, T,\theta)) \quad (5)$$

$$r3 = m/2 + b(x,T) \times f3(x,T,\theta) \times (R_1 - 1)/(f1(x,T,\theta) + f2(x,T,\theta)) \quad (6)$$

$$r4 = m/2 + b(x,T) \times f4(x,T,\theta) \times (R_1 - 1)/(f1(x,T,\theta) + f2(x,T,\theta)) \quad (7)$$

$$R_1 = r1 + r2, R_2 = r3 + r4 \quad (8)$$

where r1, r2, r3, and r4 are distances from the light-emitting part center to sides. Under these conditions, it is possible to form the rectangular or square light-emitting region 18 with the specified lengths l and m around the center of the light-emitting part (FIG. 5B).

Here, the description returns to the manufacturing method according to the first embodiment. After the wet oxidation process is performed to form the insulator portion 8 for the current aperture layer, the commercially available photoresist is coated on the substrate. The hot plate is used for baking. A photoresist film with 350 nm thickness is formed in this manner. The stepper apparatus is used to expose and transfer an isolation pattern onto the photoresist film. The isolation pattern is a resist pattern for the formation of the empty space 20 under the interconnection part 11a by etching.

The photoresist film is developed, and the post-bake process is performed. Based on this resist pattern, the wet etching is performed to remove the GaAs (contact) layer 7 and the semiconductor multilayer reflecting mirror 6 under the interconnection part 11a and form the empty space 20. The wet etching uses a mixed solution of sulfuric acid and hydrogen peroxide solution. The multilayer reflecting mirror 6 is completely removed from under the interconnection part 11a by adjusting the etching time with respect to widths of 1 to 5 $\mu$m of the interconnection part 11a.

At this time, the etching is hardly done to the light-emitting part protected by the resist.

The contact layer 7 and the multilayer reflecting mirror 6 provided at the side of the peripheral part 18 opposite to the light-emitting part 10 with the groove 16 interposed therebetween are also etched to form the empty space 20 during the etching (see FIG. 3B).

In this manner, the empty space 20 is formed under the interconnection part 11a as shown in FIG. 3C, completely preventing a leakage current from flowing outside the light-emitting part 10. Since it just needs to remove part of the layer under the interconnection part 11a for forming the empty space 20, the width of the interconnection part 11a is not specified particularly. The interconnection width may be large especially when the resist protects the side of the light-emitting part 10.

When the resist does not protect the side of the light-emitting part 10, the contact layer 7 and the semiconductor multilayer reflecting mirror 2 are etch-removed from the side of the light-emitting part 10 to form the empty space 20. Accordingly, it is necessary to prevent the etching from progressing up to the non-oxidized region in the light-emitting part 10, by setting the width of the interconnection part 11a to be smaller than or equal to the oxidation width of the semiconductor layers to be oxidized 2a and 6a.

The photoresist film is removed by means of the oxygen plasma ashing. The rear of the semiconductor substrate 1 is polished up to the substrate thickness of 120 $\mu$m. Then, an AuGe/Ni/Au film is evaporated as the n-side electrode 15 on the rear of the substrate 1, and then is sintered to complete the light-emitting device.

The vertical-cavity surface-emitting laser manufactured in this manner produces the continuous oscillation at room temperature with the wavelength of 650 nm. Since the empty space 20 completely prevents a leakage current from flowing outside the device, the threshold values and response characteristics of device are improved.

Since there are formed the contact electrode 11, the peripheral electrode 11b, and the interconnection part 11a connecting these almost at the same level height, no interconnection is broken due to a step. Consequently, it is possible to provide the device that excels in mass production and features a low price and high reliability.

The embodiment can solve the problem of causing the non-oxidized region to be an unwanted shape due to anisotropic oxidation and causing the beam pattern to be an unwanted shape based thereon. It is possible to obtain an intended beam pattern shape and easily provide the mode control of laser beam.

In addition, forming the film having a tensile stress as an etching mask film decreases a compression stress applied to the active layer and the light-emitting part center when the volume shrinkage occurs due to the oxidation of the semiconductor layer to be oxidized. Accordingly, the interfaces of the multilayers can be prevented from being cracked or damaged, improving the torelance to the thermal process after the selective oxidation process. It is possible to expect improved reliability and long life of the device.

While the embodiment uses the $Si_3N_4$ film as the film having a tensile stress, its composition ratio is not limited to 3:4. It just needs to provide an equivalent tensile stress for a silicon nitride film having the other composition ratios. While an SiN film is preferable from the viewpoint of etching workability and stress control, the similar effects are also available for the other compounds such as SiON, SiC, diamond, etc., nitride semiconductors, and compound materials containing nitrogen.

For the purpose of heat dissipation or the like, an embedding film may be used to fill the groove 16 or a film may be formed on the surface of the groove 16. When such a film is formed, it may be preferable to form the film on the surface of the device at the same time and use this film as a film having the tensile stress.

While the PECVD apparatus is used for forming the tensile stress film, it is also possible to use a film deposition apparatus such as an RF sputter apparatus and the like.

The quantum well active layer is not limited to the InGaAlP materials, but can be made of various materials such as AlGaAs, InGaAsP, etc.

The clad layer is not limited to the InGaAlP materials, but can be made of various materials such as ZnSSe, ZnMgSSe, etc.

While there has been explained the case of two semiconductor layers to be oxidized, the similar effects are available on a single layer, that is, a single current aperture. In FIG. 3A, for example, when the semiconductor layer to be oxidized 6a does not exist and only the layer 2a exists, the empty space 20 is formed between the etching mask film 9 and the layer 2a.

(Second Embodiment)

Instead of the empty space 20 in the first embodiment, the second embodiment forms a high-resistance region 30 under the interconnection part 11a by means of ion implantation. Except this, the second embodiment is substantially the same as the first embodiment. Therefore, the mutually corresponding parts in the first and second embodiments are designated by the same reference numerals and a detailed description thereof is omitted for simplicity.

Figure 6A:
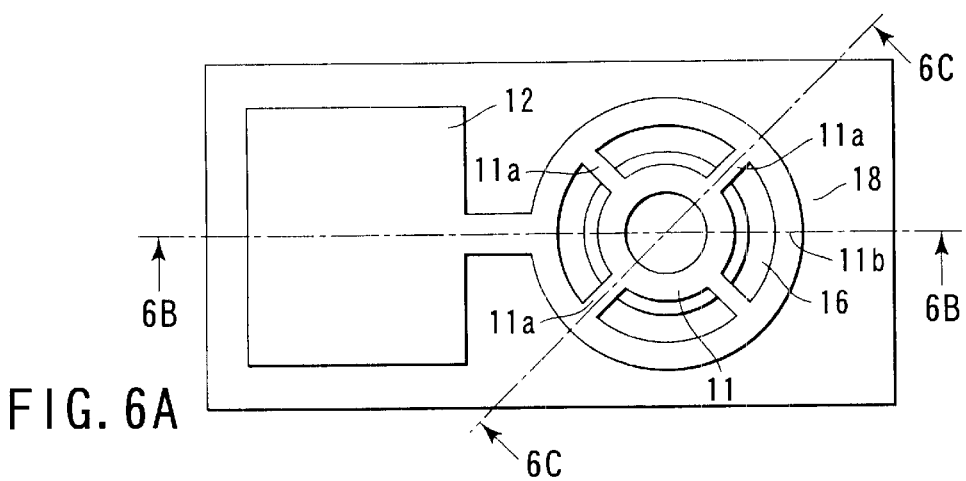
FIG. 6A is a top view showing the configuration of a semiconductor surface light-emitting device according to a second embodiment.
Figure 6B:
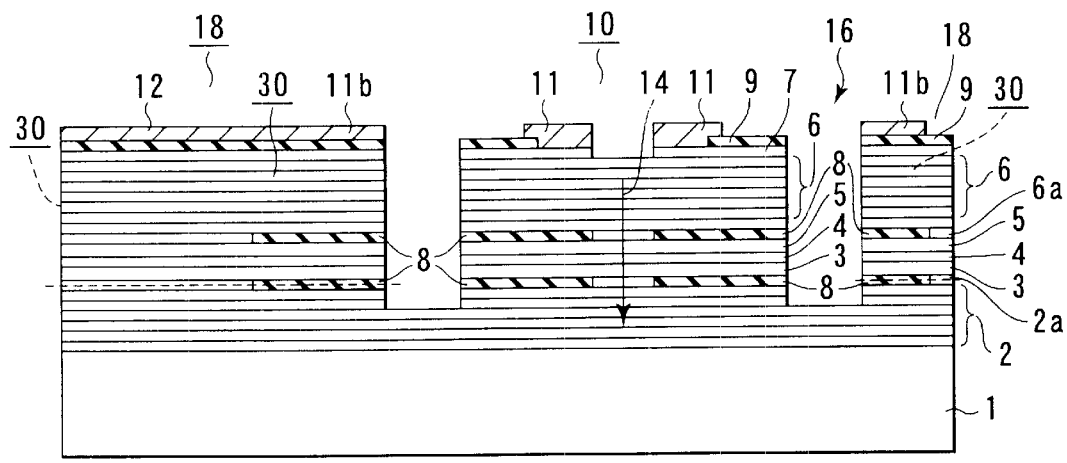
FIG. 6B is a cross-sectional view taken along the line 6B—6B in FIG. 6A.
Figure 6C:
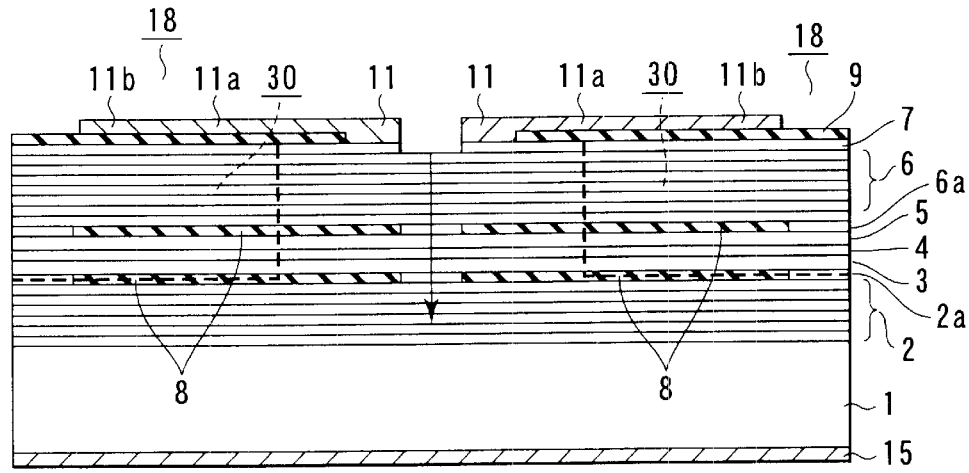
FIG. 6C is a cross-sectional view taken along the line 6C—6C in FIG. 6A.

As shown in FIGS. 6B and 6C, there is provided high-resistance regions 30 at portions of the layered structure of the peripheral part 18 and under the interconnection part 11a except the light-emitting part 10 (the regions divided by the dotted lines at both shoulder portions of the cross sections). The high-resistance regions 30 are made to have a high resistance by ion implantation, and prevent a leakage current indicated by an arrow 13 from flowing, thereby providing the similar effects described in the first embodiment.

The following describes specifically how to manufacture a vertical-cavity surface-emitting laser according to the second embodiment.

First, the MOCVD apparatus is used to form the n-type semiconductor multilayer reflecting mirror 2, the semiconductor layer to be oxidized 2a, the clad layer 3, the semiconductor active layer 4, the n-type clad layer 5, the semiconductor layer to be oxidized 6a, the p-type semiconductor multilayer reflecting mirror 6, and the contact layer 7 on the cleaned 3-inch n-type GaAs substrate 1 with the thickness of 400 $\mu$m.

Like the first embodiment, the light-emitting device according to the second embodiment uses the light-emitting part similar to the first embodiment as a basic structure and is designed as a red InGaAlP vertical-cavity surface-emitting laser with the light emission near 650 nm wavelength.

The semiconductor multilayer reflecting mirror 2 is formed of AlGaAs semiconductor doped with n-type impurities for $1 \times 10^{18}/cm^3$. The clad layer 3 is formed of n-type $In_{0.5}(Ga_{0.3}Al_{0.7})_{0.5}P$. The semiconductor active layer 4 has a quantum well structure comprising $In_xGa_{1-x}P/In_{0.5}(Ga_{0.5}Al_{0.5})_{0.5}P$ that is adjusted to cause a light emission peak wavelength to be 650 nm. The clad layer 5 is formed of p-type $In_{0.5}(Ga_{0.3}Al_{0.7})_{0.5}P$. The semiconductor multilayer reflecting mirror 6 is formed of AlGaAs semiconductor doped with p-type impurities for $1 \times 10^{18}/cm^3$. The semiconductor layer to be oxidized 2a is formed below the clad layer 3 and uses $Al_xGa_{1-x}As$ (x>0.98) having an Al composition ratio higher than that of AlGaAs forming the n-type semiconductor multilayer reflecting mirror 2. The semiconductor film to be oxidized 6a is formed above the clad layer 5 and uses $Al_xGa_{1-x}As$ (x>0.98) having an Al composition ratio higher than that of AlGaAs forming the p-type semiconductor multilayer reflecting mirror 6. The contact layer 7 is formed of p-type carbon doped GaAs.

The AlGaAs semiconductor multilayer reflecting mirror uses a structure of alternately laminating the $Al_{0.5}Ga_{0.05}As$ layer and the $Al_{0.5}Ga_{0.5}As$ layer so that the optical film thickness becomes one quarter of the cavity wavelength.

On the above-mentioned structure, there is formed the etching mask film 9 having a tensile stress of 150 MPa like in the first embodiment.

Then, a commercially available photoresist is coated on the substrate by the spin coater apparatus. The hot plate is used for baking to form a photoresist film with the film thickness of 350 nm. Then, the stepper is used to expose a mask pattern onto the photoresist film and transfer the pattern.

The first process exposes and transfers alignment mark patterns. Then, the resist film is developed, and the post-bake process is performed to form the pattern on the resist film. By using the resist film with patterns, the etching is performed to form alignment mark patterns on the etching mask film 9. The photoresist film is removed by means of oxygen plasma ashing.

Thereafter, a PA (Peroxide Ammonium) process is performed by using the etching mask film 9 and a mixture of $NH_3/H_2O_2$ to etch the alignment mark pattern only on the contact layer. Then, the commercially available photoresist is coated on the substrate. The hot plate is used for baking to form a photoresist film with the film thickness of 5 $\mu$m.

In order to form a pattern for current path isolation for the prevention of a leakage current path, the stepper is used to expose and transfer the pattern covering the light-emitting part 10 onto the photoresist film. The resist film is developed after the exposure. The post-bake process is performed to form the isolation pattern on the photoresist film for the proton implantation.

By using the resist pattern, the etching is performed to form the isolation pattern on the etching mask film 9 for the proton implantation.

A proton implantation into the peripheral part 18 (the outside portion of the light-emitting part 10) of the device with accelerating voltages of 100 kV, 200 kV, and 300 kV, successively and a dose of $1E15/cm^2$ for each, is done by an ion implantation apparatus. The high-resistance region 30 is formed in this manner.

At this time, protons are uniformly distributed in a region ranging from 0.5 to 2.5 $\mu$m in depth. The high resistance is provided up to the depth of approximately 3 $\mu$m. There is a distance of approximately 3 $\mu$m from the surface to the semiconductor active layer 4. Since the resist film is formed 5 $\mu$m thick on a resist formation portion (substantially on the top of the light-emitting part 10), all protons are absorbed in the resist film and do not reach the light-emitting part 10.

Thereafter, the oxygen plasma ashing is used to remove the resist film. The wet etching is used to remove the etching mask film 9.

The etching mask film 9 having the tensile stress of 150 MPa is formed again. Then, the commercially available photoresist is coated on the substrate. The hot plate is used for baking to form a photoresist film with the film thickness of 350 $\mu$m. The stepper is used to expose a contact hole pattern on the photoresist film to transfer the pattern. The photoresist film is developed after the exposure. The post-bake process is performed to form the contact hole pattern on the photoresist film.

By using the photoresist film pattern, the etching mask film 9 is etched to form the contact pattern thereon. The photoresist film is then removed by means of oxygen plasma ashing.

Then, the commercially available photoresist is coated on the substrate. The hot plate is used for baking to form a photoresist film with the film thickness of 350 nm. The stepper is used to expose a p-electrode pattern to the photoresist film and transfer the pattern. The photoresist film is developed after the exposure. The post-bake process is then performed. Thus, there is formed the resist pattern of the p-side contact electrode 11, the boding pad 12, the interconnection part 11a, and the peripheral interconnection part 11b.

In order to form the p-side contact electrode 11 and the like, the electron beam evaporation apparatus is used to form a Ti/Pt/Au film on the photoresist film pattern. The lift-off method and the sinter process are used to form electrodes and interconnection patterns.

A window region for laser emission is opened by pattern-etching the GaAs contact layer 7. Thereafter, the commercially available photoresist is coated on the substrate. The hot plate is used for baking. Then, a photoresist film 350 nm thick is formed. The stepper is used to expose a pattern for forming the light-emitting part 10 onto the photoresist film and transfer the pattern. The photoresist film is developed after the exposure, and the post-bake process is performed. By using the photoresist film pattern, the etching mask film 9 is etched to form the pattern for forming the light-emitting part 10 thereon.

Based on the etching mask film 9, the plasma dry etching is done by using a chlorine-based gas to the multi-layered structure to form a plurality of the grooves 16 and accordingly form the light-emitting part 10. Then, the oxygen plasma ashing is performed to remove the photoresist film.

Then, the wet oxidation process is preformed at 400° to 500° C. in a water vapor atmosphere to selectively oxidize the semiconductor layers to be oxidized 6a and 2a in a lateral direction. Like the first embodiment, the non-oxidized region can be controlled to any shape by arranging the light-emitting part 10, and it is possible to decrease a compression stress applied to the semiconductor active layer 3 by using the tensile stress film.

The substrate 1 is polished from the rear so that the thickness becomes 120 μm. Then, an AuGe/Ni/Au film is evaporated as the n-side electrode 15 on the rear of the substrate 1, and then is sintered to complete the device.

In the vertical-cavity surface-emitting laser manufactured according to the second embodiment, the high-resistance region is formed by proton implantation in the layer under the interconnection part 11a. As indicated by the arrow 13, a leakage current outside the light-emitting part is prevented completely.

As mentioned above, the semiconductor surface light-emitting device according to the present invention can provide the following remarkable effects. Namely, it is possible to suppress a leakage current outside the light-emitting part for a low threshold value, fast response, and improved mass-producibility. It is possible to improve a non-oxidized region shape caused by anisotropic oxidation, a beam pattern shape, and the mode control of laser beam. Moreover, it is possible to decrease a compression stress applied to the light-emitting part due to the volume shrinkage which is accompanied by oxidation of the high Al-content layer, prevent interfaces in the light-emitting part from being cracked or damaged, and increase the tolerance to a heat process after the selective oxidation process. Consequently, it is possible to provide the semiconductor surface light-emitting device having improved reliability and long life.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor light-emitting device which emits light vertical to a top surface, comprising:
    a substrate having a first principal surface and a second principal surface;
    a first electrode formed on the first principal surface of the substrate;
    a multi-layered structure having a light-emitting part, a groove, and a peripheral part which is formed on the second principal surface of the substrate;
    the light-emitting part being of a column shape substantially surrounded by the groove extending from a surface of the multi-layered structure and substantially isolated from the peripheral part by the groove, the groove having deeper portions and shallower portions alternately arranged, the light-emitting part comprising,
        a first multi-layered reflecting mirror layer formed on the second principal surface of the substrate, the deeper portions of the groove extending into the first multi-layered reflecting mirror layer,
        a semiconductor active layer formed above the first multi-layered reflecting mirror layer,
        a second multi-layered reflecting mirror layer formed above the semiconductor active layer, and
        a current confinement path defined and surrounded by an oxidized region of at least one of the first and second multi-layered reflecting mirror layers, the shallower portions of the groove extending to the oxidized region and having bottoms thereof on the oxidized region;
    the peripheral part of the multi-layered structure surrounding the light-emitting part via the groove;
    a second electrode formed on the top surface of the light-emitting part and having an opening formed above the current confinement path, the second electrode being configured to make a current path to the first electrode through the current confinement path;
    a third electrode for external connection formed on the peripheral part of the multi-layered structure; and
    a plurality of interconnection conductors bridging between the second and third electrodes to establish electrical connections above the shallower portions of the groove, respectively.

2. The semiconductor light-emitting device according to claim 1, further comprising a film with a tensile stress formed on the top surface of the multi-layered structure.

3. The semiconductor light-emitting device according to claim 1, wherein the first multi-layered reflecting mirror layer and the second multi-layered reflecting mirror layer face with each other to configure a vertical cavity.

4. The semiconductor light-emitting device according to claim 1, wherein the second electrode is annularly formed at a peripheral portion on the top surface of the light-emitting part and the third electrode has an annular region surrounding the groove and a pad region for external connection in the peripheral part.

5. The semiconductor light-emitting device according to claim 1, wherein the groove is symmetrically arranged with respect to the center of the light-emitting part.

6. A semiconductor light-emitting device which emits light vertical to a top surface, comprising:
    a substrate having a first principal surface and a second principal surface;
    a first electrode formed on the first principal surface of the substrate;
    a multi-layered structure having a light-emitting part, grooves, and a peripheral part which is formed on the second principal surface of the substrate;
    the light-emitting part being of a column shape substantially surrounded by the grooves extending from a surface of the multi-layered structure and partially connected to the peripheral part at high resistance connecting portions between opposing ends of adjacent ones of the grooves, the light-emitting part comprising,
        a first multi-layered reflecting mirror layer formed on the second principal surface of the substrate, the grooves extending into the first multi-layered reflecting mirror layer,
        a semiconductor active layer formed above the first multi-layered reflecting mirror layer,
        a second multi-layered reflecting mirror layer formed above the semiconductor active layer, and
        a current confinement path defined and surrounded by an oxidized region of at least one of the first and second multi-layered reflecting mirror layers; the peripheral part of the multi-layered structure surrounding the light-emitting part via the grooves;
    a second electrode formed on the top surface of the light-emitting part and having an opening formed above the current confinement path, the second electrode being configured to make a current path to the first electrode through the current confinement path;
    a third electrode for external connection formed on the peripheral part of the multi-layered structure; and
    a plurality of interconnection conductors formed on the connecting portions and connecting the second electrode with the third electrode.

7. The semiconductor light-emitting device according to claim 6, further comprising a film with a tensile stress formed on a top surface of the multi-layered structure.

8. The semiconductor light-emitting device according to claim 6, wherein the first multi-layered reflecting mirror layer and the second multi-layered reflecting mirror layer face with each other to configure a vertical cavity.

9. The semiconductor light-emitting device according to claim 6, wherein the second electrode is annularly formed at the peripheral portion on the top surface of the light-emitting part and the third electrode has an annular region surrounding the grooves and a pad region for external connection on the peripheral part.

10. The semiconductor light-emitting device according to claim 6, wherein the grooves are symmetrically arranged with respect to the center of the light-emitting part.

11. A semiconductor light-emitting device which emits light vertical to a top surface, comprising:
  a substrate having a first principal surface and a second principal surface;
  a first electrode formed on the first principal surface of the substrate;
  a multi-layered structure having a light-emitting part, grooves, and a peripheral part which is formed on the second principal surface of the substrate;
  the light-emitting part being of a column shape substantially surrounded by the grooves extending from a surface of the multi-layered structure and partially connected to the peripheral part at high resistance connecting portions between opposing ends of adjacent ones of the grooves, the light-emitting part comprising,
    a first multi-layered reflecting mirror layer formed on the second principal surface of the substrate, the grooves extending into the first multi-layered reflecting mirror layer,
    a semiconductor active layer formed above the first multi-layered reflecting mirror layer,
    a second multi-layered reflecting mirror layer formed above the semiconductor active layer, and
    a current confinement path defined and surrounded by an oxidized region of at least one of the first and second multi-layered reflecting mirror layers, and the oxidized region having oxidation anisotropy providing a first direction of a high oxidation rate and a second direction of low oxidation rate with respect to a crystal orientation of the first multi-layered reflecting mirror layer or the second multi-layered reflecting mirror layer, a distance from a side of the light-emitting part to the current confinement path in the first direction being longer than a distance from a side of the light-emitting part to the light-emitting region in the second direction; the peripheral part of the multi-layered structure surrounding the light-emitting part via the grooves;
  a second electrode formed on the top surface of the light-emitting part and having an opening formed above the current confinement path, the second electrode being configured to make a current path to the first electrode through the current confinement path;
  a third electrode for external connection formed on the peripheral part of the multi-layered structure; and
  a plurality of interconnection conductors formed on the connecting portions and connecting the second electrode with the third electrode.

12. The semiconductor light-emitting device according to claim 11, further comprising a film with a tensile stress formed on a top surface of the multi-layered structure.

13. The semiconductor light-emitting device according to claim 11, wherein the first multi-layered reflecting mirror layer and the second multi-layered reflecting mirror layer face with each other to configure a vertical cavity.

14. The semiconductor light-emitting device according to claim 11, wherein the second electrode is annularly formed at a peripheral portion on the top surface of the light-emitting part and the third electrode has an annular region surrounding the grooves and a pad region for external connection on the peripheral part.

15. The semiconductor light-emitting device according to claim 11, wherein the plurality of grooves are symmetrically arranged with respect to the center of the light-emitting part.

16. A semiconductor light-emitting device which emits light vertical to a top surface, comprising:
  a substrate having a first principal surface and a second principal surface;
  a first electrode formed on the first principal surface of the substrate;
  a multi-layered structure having a light-emitting part, grooves, and a peripheral part which is formed on the second principal surface of the substrate;
  the light-emitting part being of a column shape substantially surrounded by the grooves extending from a surface of the multi-layered structure and partially connected to the peripheral part at high resistance connecting portions between opposing ends of adjacent ones of the grooves, the light-emitting part comprising,
    a first multi-layered reflecting mirror layer formed on the second principal surface of the substrate, the grooves extending into the first multi-layered reflecting mirror layer,
    semiconductor active layer formed above the first multi-layered reflecting mirror layer,
    a second multi-layered reflecting mirror layer formed above the semiconductor active layer, and
    a current confinement path defined and surrounded by an oxidized region of at least one of the first and second multi-layered reflecting mirror layers, and the oxidized region having oxidation anisotropy providing a first direction of a high oxidation rate and a second direction of low oxidation rate with respect to a crystal orientation of the first multi-layered reflecting mirror layer or the second multi-layered reflecting mirror layer, the first direction being directed to the high resistance connecting portions;
  the peripheral part of the multi-layered structure surrounding the light-emitting part via the grooves;
  a second electrode formed on the top surface of the light-emitting part and having an opening formed above the current confinement path, the second electrode being configured to make a current path to the first electrode through the current confinement path;
  a third electrode for external connection formed on the peripheral part of the multi-layered structure; and
  a plurality of interconnection conductors formed on the connecting portions and connecting the second electrode with the third electrode.

17. The semiconductor light-emitting device according to claim 16, further comprising a film with a tensile stress formed on a top surface of the multi-layered structure.

18. The semiconductor light-emitting device according to claim 16, wherein the first multi-layered reflecting mirror layer and the second multi-layered reflecting mirror layer face with each other to configure a vertical cavity.

19. The semiconductor light-emitting device according to claim 16, wherein the second electrode is annularly formed at a peripheral portion on the top surface of the light-emitting part and the third electrode has an annular region surrounding the plurality of grooves and a pad region for external connection in the peripheral part.

20. The semiconductor light-emitting device according to claim 16, wherein the plurality of grooves are symmetrically arranged with respect to the center of the light-emitting part.

* * * * *